United States Patent
Wischnewskiy et al.

(10) Patent No.: US 10,381,955 B2
(45) Date of Patent: Aug. 13, 2019

(54) ULTRASONIC ACTUATOR

(71) Applicant: PHYSIK INSTRUMENTE (PI) GMBH & CO. KG, Karlsruhe (DE)

(72) Inventors: Wladimir Wischnewskiy, Rathenow (DE); Alexej Wischnewski, Woerth (DE)

(73) Assignee: PHYSIK INSTRUMENTE (PI) GMBH & CO. KG, Karlsruhe (DE)

(*) Notice: Subject to any disclaimer, the term of this patent is extended or adjusted under 35 U.S.C. 154(b) by 486 days.

(21) Appl. No.: 15/312,386

(22) PCT Filed: May 8, 2015

(86) PCT No.: PCT/DE2015/100185
§ 371 (c)(1),
(2) Date: Nov. 18, 2016

(87) PCT Pub. No.: WO2015/176711
PCT Pub. Date: Nov. 26, 2015

(65) Prior Publication Data
US 2017/0126147 A1 May 4, 2017

(30) Foreign Application Priority Data
May 19, 2014 (DE) .................. 10 2014 209 419

(51) Int. Cl.
*H01L 41/047* (2006.01)
*H01L 41/083* (2006.01)
(Continued)

(52) U.S. Cl.
CPC ......... *H02N 2/001* (2013.01); *H01L 41/0471* (2013.01); *H01L 41/083* (2013.01);
(Continued)

(58) Field of Classification Search
CPC .......... H02N 2/001; H02N 2/02; H02N 2/026; H01L 41/0471; H01L 41/083; H01L 41/0986
(Continued)

(56) References Cited

U.S. PATENT DOCUMENTS

| 8,928,205 B2 | 1/2015 | Koc |
| 2001/0011858 A1* | 8/2001 | Iino .................. H02N 2/0015 310/323.06 |

(Continued)

FOREIGN PATENT DOCUMENTS

| DE | 202009014046 | 1/2010 |
| DE | 102009049719 | 4/2011 |

OTHER PUBLICATIONS

International Search Report for PCT/DE2015/100185, English Translation attached to original, Both completed by the European Patent Office dated Sep. 15, 2015, All together 5 Pages.

*Primary Examiner* — Thomas M Dougherty
(74) *Attorney, Agent, or Firm* — Brooks Kushman P.C.

(57) ABSTRACT

An ultrasonic actuator made of polarized piezoelectric material in the form of a single-layer or multilayer flat rectangular plate with two main faces, at least four lateral faces joining the main faces, and a thickness T, which is defined by the distance between the main faces in the direction of their surface normals, and wherein on both the one main face and the other opposite main face at least one layer including two triangular electrodes imposingly arranged and separated by a diagonal separating region, the electrodes on the one main face being offset relative to the electrodes on the other main face by 90°. The ultrasonic actuator is characterized in that on at least one of the lateral faces there are two mutually spaced friction elements designed to contact at least one element that is to be driven by the ultrasonic actuator.

15 Claims, 9 Drawing Sheets

(51) Int. Cl.
*H01L 41/09* (2006.01)
*H02N 2/00* (2006.01)
*H02N 2/02* (2006.01)

(52) U.S. Cl.
CPC ......... *H01L 41/0986* (2013.01); *H02N 2/002* (2013.01); *H02N 2/026* (2013.01)

(58) Field of Classification Search
USPC ............... 310/323.01–323.19, 328, 365, 366
See application file for complete search history.

(56) References Cited

U.S. PATENT DOCUMENTS

| | | |
|---|---|---|
| 2008/0179996 A1 | 7/2008 | Adachi |
| 2012/0169181 A1 | 7/2012 | Lee et al. |
| 2015/0042209 A1 | 2/2015 | Wischenwskiy et al. |

\* cited by examiner

ULTRASONIC ACTUATOR

CROSS-REFERENCE TO RELATED APPLICATION

This application is the U.S. national phase of PCT Application No. PCT/DE2015/100185 filed on May 8, 2015, which claims priority to DE Patent Application No. 10 2014 209 419.4 filed on May 19, 2014, the disclosures of which are incorporated in their entirety by reference herein.

The invention relates to an ultrasonic actuator and to a method for operating such an ultrasonic actuator.

DE102009049719A1 has disclosed a generic ultrasonic actuator. It is configured in such a way that a so-called stick-slip drive is realizable thereby, i.e. a drive in which stick phases and slip phases permanently alternate. During a stick phase, in which an element to be driven is moved along with the friction element arranged on the ultrasonic actuator on account of the existing frictional contact, there is an actual displacement or movement of the element to be driven in a direction defined by the movement of the friction element. In the subsequent slip phase, the friction element performs a movement in a direction which is substantially opposite to the movement direction during the stick phase. Since this backward movement occurs substantially more quickly than the forward movement during the stick phase, the element to be driven may only follow this fast movement to a very restricted extent on account of the inertia thereof, and so there is only a small movement of the element to be driven in a direction opposite to the drive direction during the slip phase.

In the ultrasonic actuator known from the prior art, a friction element or a plurality of friction elements is/are arranged on one of the main surfaces, which are largest in terms of surface area, and so the friction element or the friction elements move substantially parallel to the corresponding main surface in the case of a deformation of the ultrasonic actuator on account of an appropriate electrical actuation—with the deformation occurring substantially in the plane of the plate-shaped ultrasonic actuator. In this manner, a corresponding stick-slip drive is realizable in the ultrasonic actuator known from the prior art, in which stick-slip drive the friction element must carry out a movement in a direction lying substantially parallel to the surface of the element to be driven.

However, stick-slip drives have disadvantages on account of the principle thereof. In this context, what should be listed above all is the above-described movement of the element to be driven during the slip phase, which movement is counter to the actual drive direction and hence parasitic. A further disadvantage lies in the relatively low driving force.

Thus, it is an object of the invention to provide an ultrasonic actuator, by means of which a more effective drive is realizable in relation to the ultrasonic actuator known from the prior art.

This object is achieved by an ultrasonic actuator as claimed in claim 1, with the dependent claims following this comprising at least expedient configurations and developments.

Accordingly, an ultrasonic actuator is taken as a starting point, said ultrasonic actuator being made of polarized, piezoelectric material in the form of a single layered or multilayered flat rectangular plate having two main surfaces, which are largest in terms of surface area, and at least four side surfaces connecting the main surfaces to one another. The thickness T of this ultrasonic actuator is defined by the normal distance between the main surfaces. At least one layer of the ultrasonic actuator respectively comprises, both on the one main surface and on the other main surface arranged opposite thereto, two triangular electrodes arranged opposite one another, said electrodes being spaced apart from one another by a separation region extending diagonally. The term "arranged opposite one another" should in this context be understood to mean an arrangement opposite one another in the plane in which the electrodes lie. The two electrodes of one main surface are arranged offset by 90° to the two electrodes of the other main surface. The ultrasonic actuator according to the invention is characterized in that two friction elements which are spaced apart from one another and provided for contact with at least one element to be driven by the ultrasonic actuator are arranged on at least one of the side surfaces.

When an electric voltage is applied only to the electrodes arranged on one of the main surfaces, the second mode of an acoustic deformation standing wave is generated in the ultrasonic actuator, said standing wave spreading along the separation region of the other, opposite main surface, with the spread of the acoustic deformation standing wave causing the two friction elements arranged on one of the side surfaces to carry out a movement, in particular an elliptical movement, suitable for driving an element to be driven which may be brought into contact with the friction elements. By means of such a (driving) movement of the friction element, a drive is accomplished, in which there are no parasitic movements of the element to be driven.

It may be advantageous if the friction elements are each arranged in the region of the side surface adjoined by the adjacent side surface.

It may likewise be advantageous if the friction elements are arranged on the side surface in such a way that they terminate flush with the adjacent side surface.

It may also be advantageous if the ultrasonic actuator has four friction elements overall, the friction elements being arranged on opposite side surfaces.

Furthermore, it may be advantageous if the ultrasonic actuator is multilayered and has a plurality of layers of polarized and piezo-ceramic material, the polarization directions of adjacent layers being different and preferably opposite to one another.

Moreover, it may be advantageous if the thickness T is less than one third of the length of a side surface and more than one twentieth of the length of the same side surface.

In a schematic manner and not to scale:

FIG. 1 shows an exploded view of an ultrasonic motor comprising an ultrasonic actuator according to the invention;

FIG. 2 shows in illustration 12 a perspective view of an ultrasonic actuator according to the invention with a view of the upper side thereof; and in illustration 13 the ultrasonic actuator according to the illustration 12 with a view of the lower side thereof;

Figure 7:
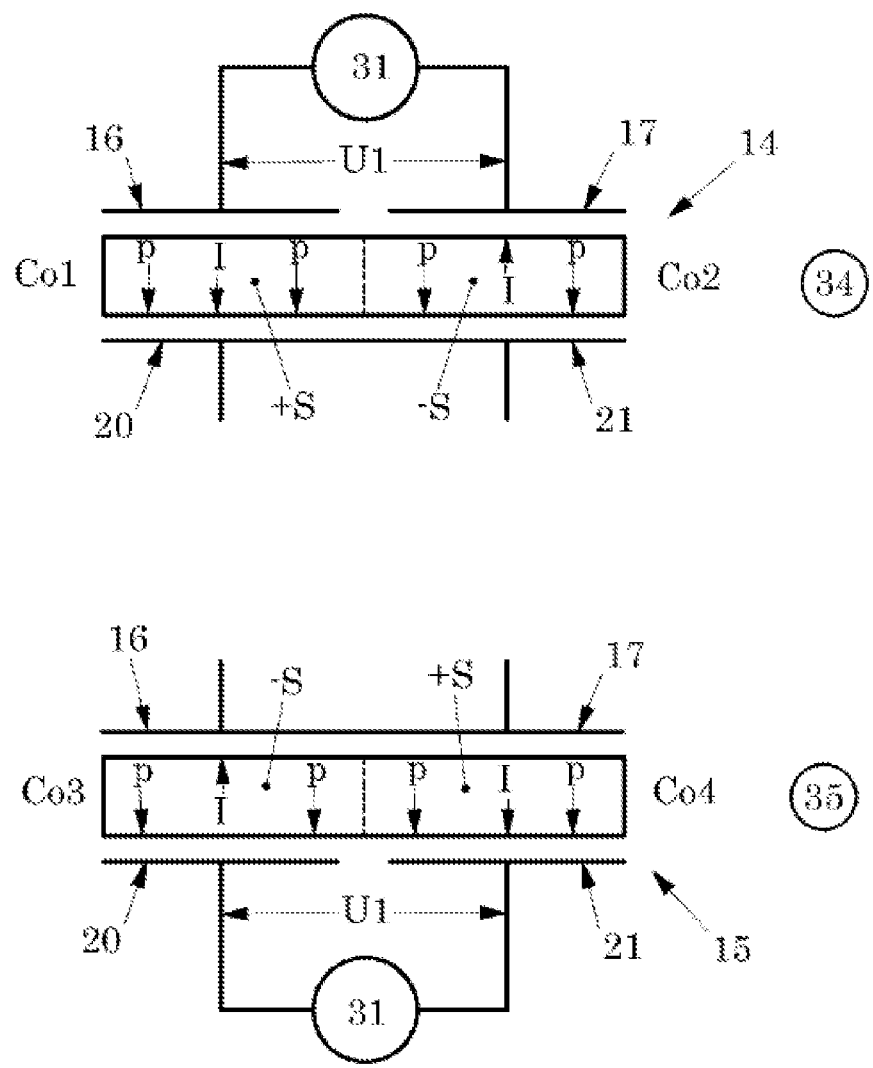
FIG. 7 shows illustrations 34 and 35 which serve to explain the principle of operation of the ultrasonic actuator according to the invention.
Figure 8:
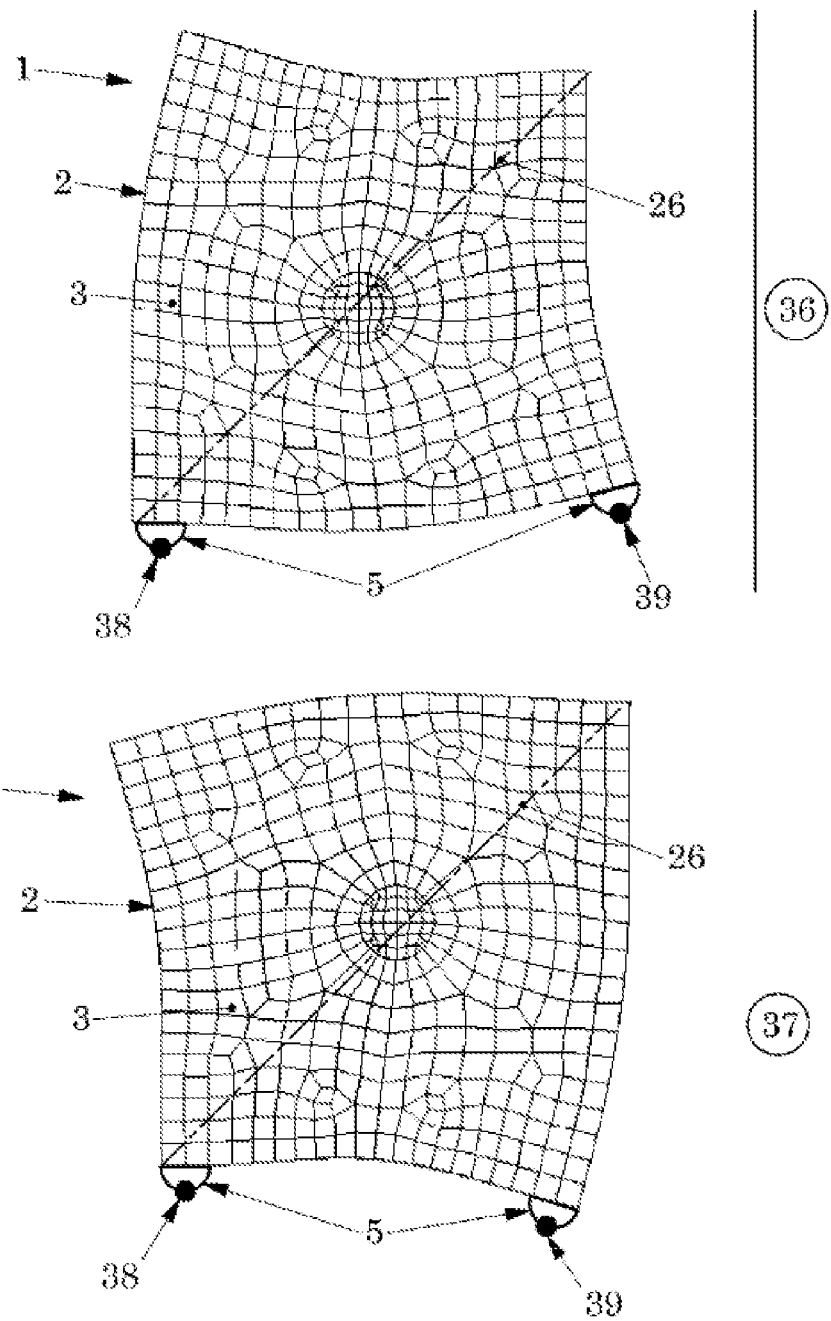
Figure 9:
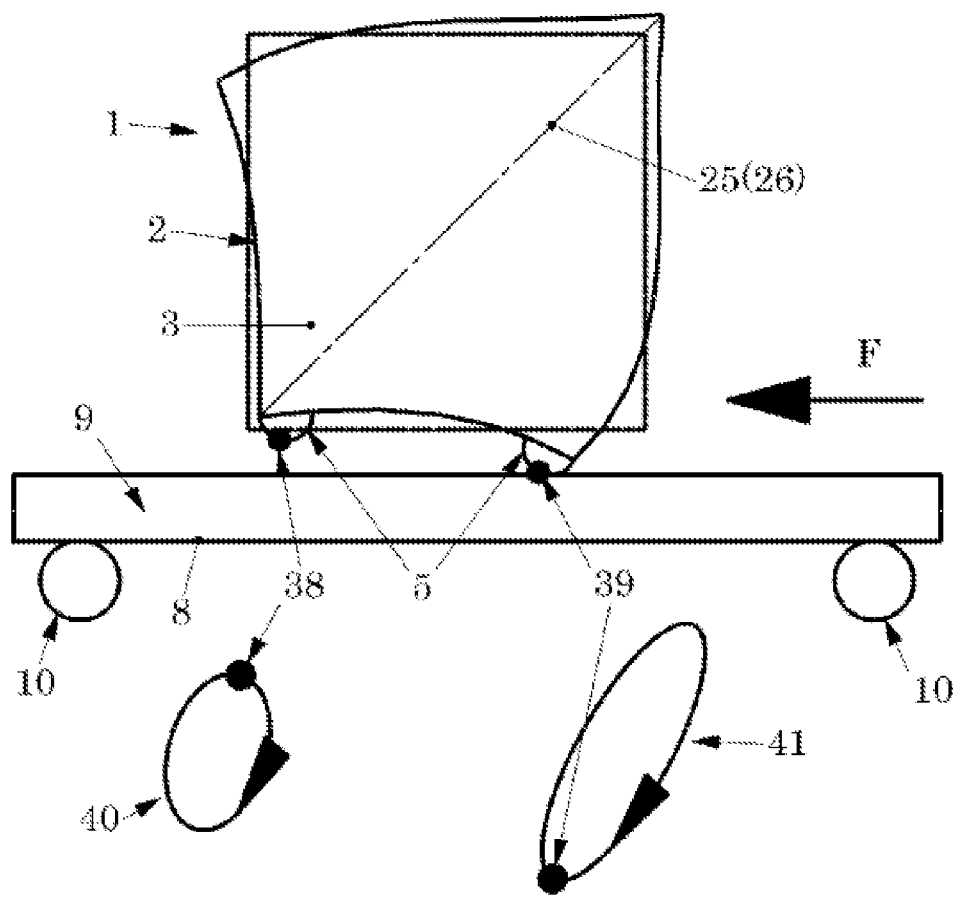
Figure 10:
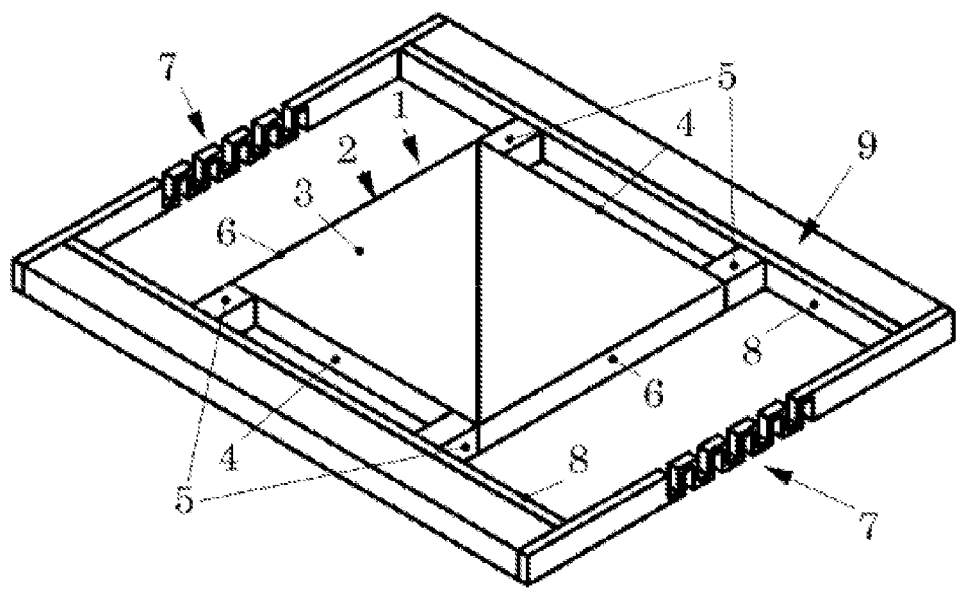

FIG. 8 shows illustration 36 showing the simulation of the deformation of an ultrasonic actuator according to the invention in the case of an electrical actuation in accordance with illustration 34 in FIG. 7; and illustration 37 shows a simulation of the deformation of an ultrasonic actuator according to the invention in the case of an electrical actuation in accordance with illustration 35 in FIG. 7;

FIG. 9 shows trajectories of the friction elements of an ultrasonic actuator according to the invention in the case of a single-phase actuation and corresponding engagement or contact conditions with an element to be driven by the ultrasonic actuator; and FIG. 10 shows a further embodiment of an ultrasonic motor comprising an ultrasonic actuator according to the invention.

Figure 1:
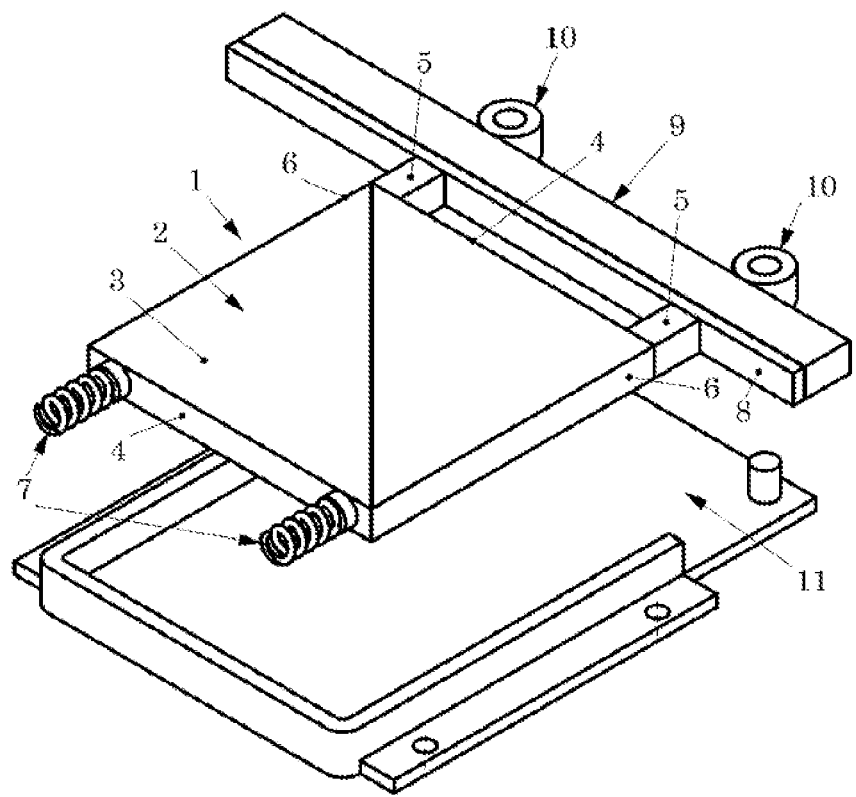

FIG. 1 shows an ultrasonic motor comprising an ultrasonic actuator 1 according to the invention, the latter being embodied as a piezoelectric, square plate 3, the ultrasonic actuator acting as a waveguide resonator 2. Two spaced apart friction elements are arranged at one of the side surfaces thereof, which forms an end face 4. The friction elements 5 are cuboid and one of the side surfaces thereof coincides with the corresponding side surface 6 of the plate 3 such that the two side surfaces terminate flush with one another. Two spring elements 7 are arranged on the other, opposite end face 4, said spring elements pressing the ultrasonic actuator or the two friction elements 5 thereof against the friction surface 8 of an element 9 to be driven, the element to be driven being mounted in a movable manner by bearing elements 10 in the form of ball bearings. The spring elements 7 are supported on the frame 11 on which the bearing elements 10 are also mounted.

Figure 2:
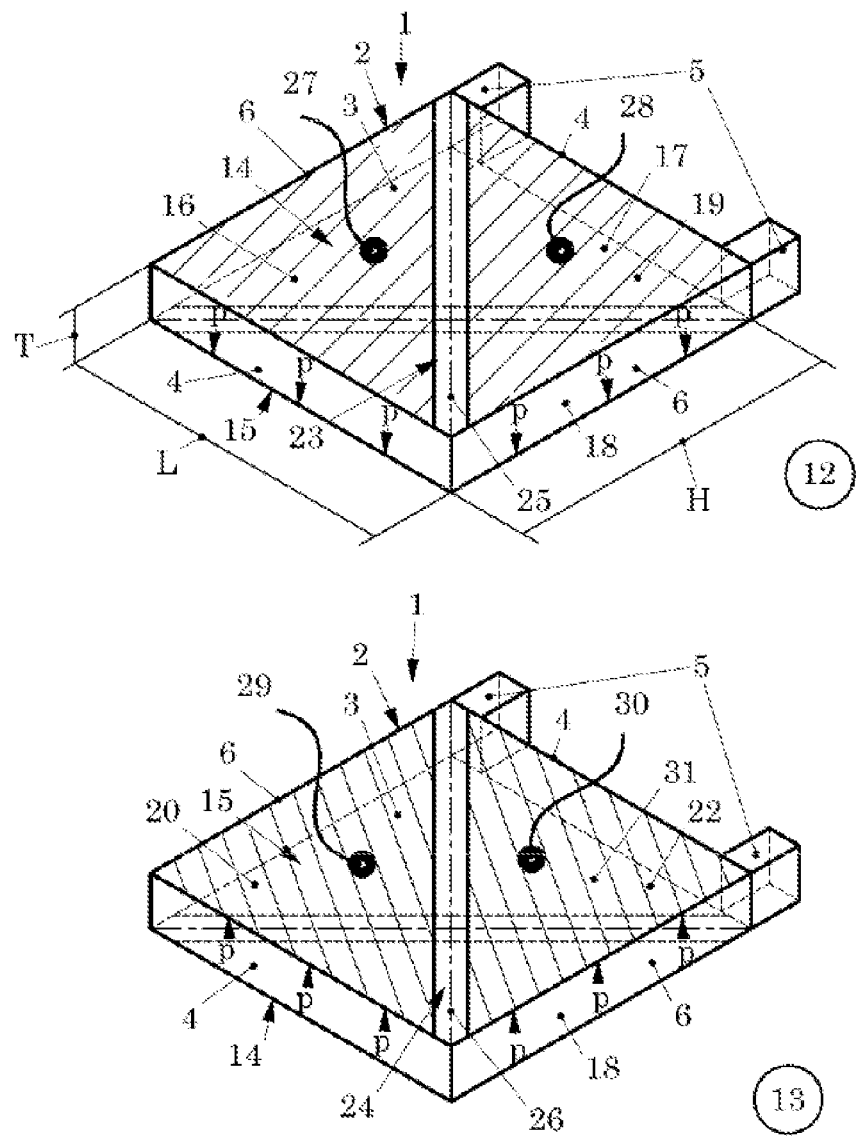

FIG. 2 shows an ultrasonic actuator according to the invention with a view of the upper side thereof in illustration 12, while illustration 13 of FIG. 2 shows the same ultrasonic actuator with a view of the lower side thereof.

The ultrasonic actuator has a length L, a height H and a thickness T. In the present case, the height H equals the length L, i.e. the plate 3 or the ultrasonic actuator 1 is square. However, it is also conceivable for the height H to differ insubstantially (i.e. ≤10%) from the length L. In this case, the plate may have a rectangular form. The thickness T may vary in the range of L/3>T>L/20, with the thickness being defined by the mutual distance of the two main surfaces in the direction of the surface normals thereof.

The two friction elements 5 are fastened near to their two side faces 6 on one of the side faces, forming the end faces 4, of the piezoelectric plate 3.

The ultrasonic actuator 1 has two generators 14 and 15 for acoustic standing waves. The generator 14 comprises the two triangular electrodes 16 and 17 and the portion of the layer 18 of piezoelectric material which is adjacent to the electrodes 16 and 17 and adjoins these in the thickness direction of the plate 3. Here, the electrodes 16 and 17 are arranged on the main surface 19 of the piezoelectric plate 3.

The generator 15 likewise comprises two triangular electrodes 20 and 21 and the portion of the layer 18 of piezoelectric material which is adjacent to the electrodes 20 and 21 and adjoins these in the thickness direction of the plate 3. The electrodes 20, are arranged on the other main surface 22, lying opposite the main surface 19, of the piezoelectric plate 3.

The piezo-ceramic plate 3 or the piezoelectric material of the layer 18 is polarized normal to the electrodes 16 and 17, and 20 and 21 respectively. Here, the index p denotes the polarization direction in FIG. 2.

The electrodes 16 and 17, and the electrodes 20 and 21, are separated from one another in each case by the isolation distances 23 and 24 which are directed in a diagonally different (i.e. opposite) manner, which isolation distances are arranged parallel to the differently directed diagonals 25 and 26 of the surfaces 19 and 22.

Both the electrodes 16 and 17 and the electrodes 20 and 21 have feed lines 27 and 28, and 29 and 30, respectively, for electrically connecting the electrodes to an electric excitation apparatus, which is not shown in FIG. 2.

Figure 3:
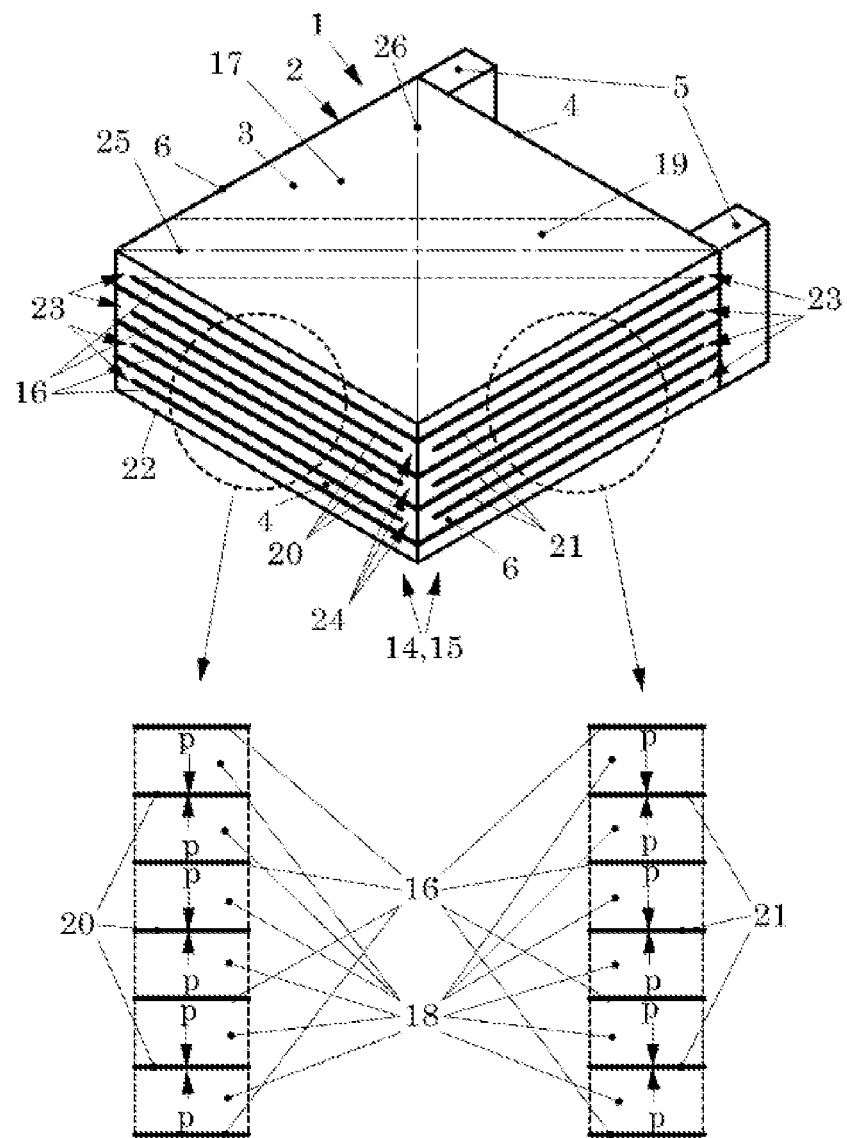
FIG. 3 shows a perspective illustration of an ultrasonic actuator according to the invention with a multilayer design.

FIG. 3 shows a structural embodiment of an ultrasonic actuator according to the invention in a many layer or multilayer structure.

In this embodiment of the ultrasonic actuator 1, each generator 14 and 15 of acoustic standing waves is constructed from alternating pairs of triangular electrodes 17 and 18, and respectively 20 and 21, and the layers 18 of piezoelectric material therebetween. The electrodes 17 and 18, and 20 and 21, and the layers of piezo-ceramic material are introduced therebetween in the interior of the piezoelectric plate 3 and parallel to the main surfaces 19 and 22 of the piezoelectric plate 3 of the waveguide resonator 2.

On the basis of the detailed illustrations of FIG. 3, it is possible to identify that the polarization directions of adjacent layers 18 of piezoelectric material are counter to one another, with the respective polarization directions always extending perpendicular to the electrodes.

Figure 4:
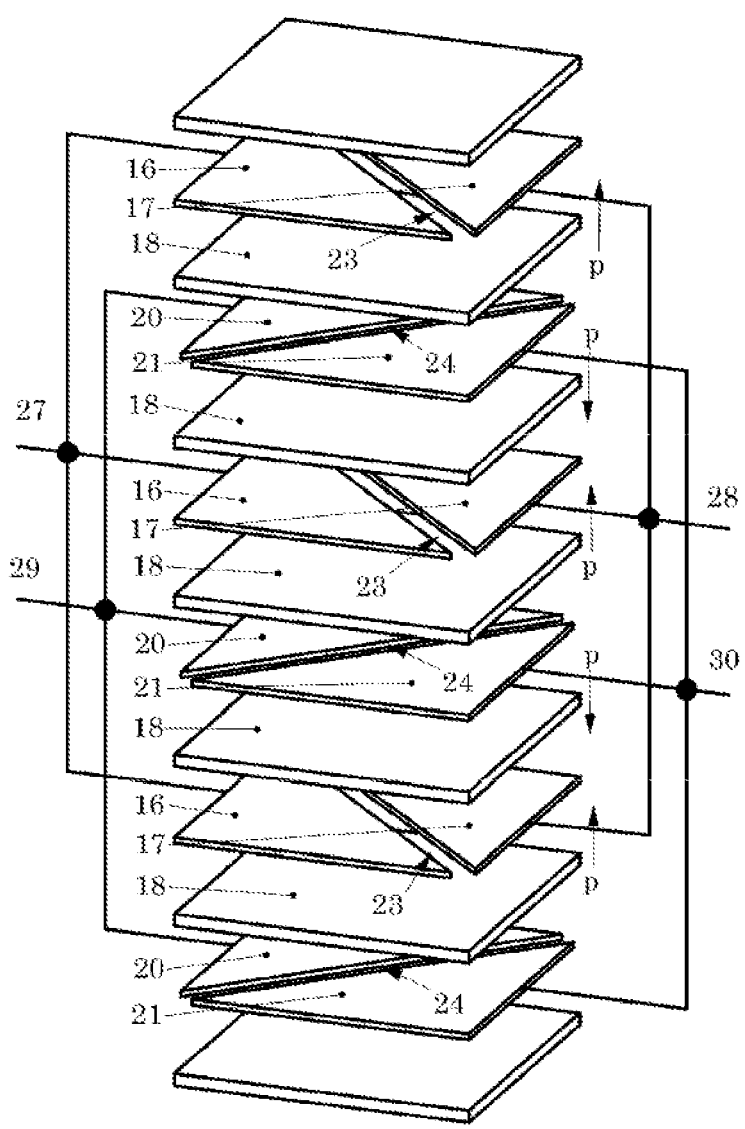
FIG. 4 shows an exploded view of the ultrasonic actuator in accordance with FIG. 3.

In an exploded view, FIG. 4 elucidates the (internal) structure of the ultrasonic actuator in the multilayer structure in accordance with FIG. 3.

Here, each electrode 16 has a connection 27, each electrode 17 has a connection 28, each electrode has a connection 29 and each electrode 21 has a connection 30.

In terms of structure, the ultrasonic actuator according to the invention is designed in such a way that the generators 14 and 15 are arranged within one another, with the whole volume of piezo-ceramic of the piezo-ceramic plate 3 of the waveguide resonator 2 being used in each generator 14 or 15 for generating the acoustic standing wave.

Figure 5:
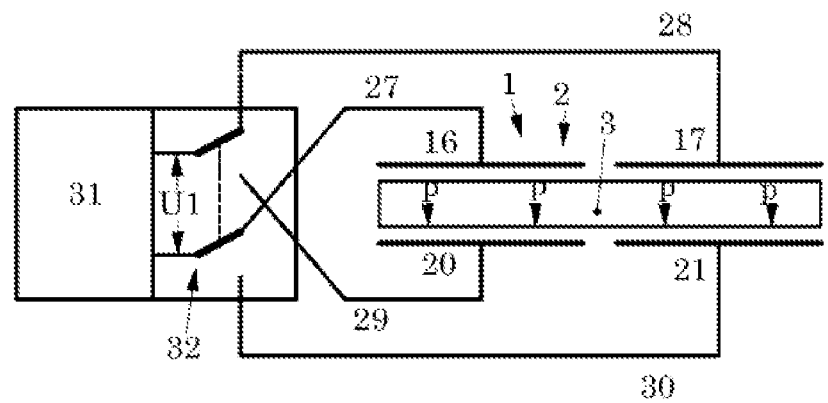
FIG. 5 shows a block diagram relating to a possible type of the electrical actuation of an ultrasonic actuator according to the invention.

In a block diagram, FIG. 5 shows a possible electrical connection of an ultrasonic actuator according to the invention with a single phase electrical excitation apparatus 31. Here, the electrical excitation apparatus 31 provides the AC voltage U1 with the frequency fo, at which the second mode of the acoustic diagonal deformation standing wave is generated in the waveguide resonator 2 of the ultrasonic actuator 1.

For the alternating connection of the voltage U1 to the electrodes 16 and 17 or the electrodes 20 and of the ultrasonic actuator 1, the electrical excitation apparatus 31 is equipped with a changeover switch 32.

Figure 6:
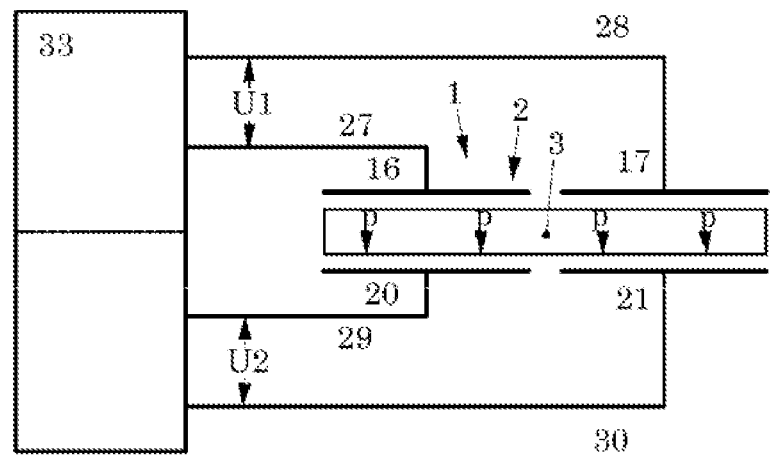
FIG. 6 shows a block diagram relating to a further possible type of the electrical actuation of an ultrasonic actuator according to the invention.

FIG. 6 shows a block diagram of a possible electrical connection of an ultrasonic actuator 1 according to the invention with a two-phase electrical excitation apparatus 33. Here, the electrical excitation apparatus 33 provides the electrical voltage U1 and the electrical voltage U2 with the same frequency fo and the phase shift φ between the voltages U1 and U2.

The illustrations 34 and 35 of FIG. 7 serve to explain the principle of operation of the ultrasonic actuator according to the invention.

When applying the voltage U1 to the electrodes 16 and 17 of the generator 14 (in accordance with illustration 34 of FIG. 7), the electric current I flows via the electric capacitance Co1 and electric capacitance Co2. The capacitance Co1 forms between the electrode 16 and part of the electrodes 20 and 21, while the capacitance Co2 forms between the electrode 17 and part of the electrodes 20 and 21. The electric current causes a deformation +S of the piezo-ceramic material under the electrode 16 and an anti-phase deformation −S of the piezo-ceramic material under the electrode 17 of the piezoelectric plate 3.

As a result, the second mode of the acoustic diagonal deformation standing wave is generated in the waveguide resonator 2, said deformation standing wave spreading along the diagonal 26 of the piezo-ceramic plate 3. Here, illustrations 36 and 37 of FIG. 8 show the two phases of maximum deformation.

When applying the voltage U1 to the electrodes 20 and 21 of the generator 15, the electric current I flows via the electric capacitance Co3 and electric capacitance Co4. The electric capacitance Co3 forms between the electrode 20 and part of the electrodes 16 and 17, and the electric capacitance Co4 forms between part of the electrodes 16 and 17 and the electrode 21. This electric current causes a deformation −S of the piezo-ceramic material under the electrode 20 and an anti-phase deformation +S of the piezo-ceramic material under the electrode 21.

As a result, the second mode of the acoustic diagonal deformation standing wave is generated in the waveguide resonator 2, said deformation standing wave spreading along the diagonal 25 of the piezo-ceramic plate 3.

As a result of the spread of the acoustic diagonal deformation standing wave in the ultrasonic actuator 1, the friction elements 5 and the points 38 and 39 move on their closed trajectories 40 and 41 which are only directed in one direction, as depicted in FIG. 9.

On account of the frictional interaction of the friction elements 5 with the friction layer or friction surface 8 of the element 9 to be driven, the ultrasonic actuator 1 transfers the deformation movements via the friction elements to the element to be driven, with the movement components in the drive direction of the element to be driven exerting a corresponding driving force onto the element to be driven.

By actuating the changeover switch 32, the excitation voltage U1 is applied from the electrodes of the one generator 14 or 15 to the electrodes of the other generator 15 or 14, as a result of which the movement direction of the element 9 to be driven changes (i.e. inverts).

In the case of a single-phase stimulus or excitation of the ultrasonic actuator according to the invention, the trajectories 40 and 41 of the friction elements 5 differ slightly from one another in terms of the form thereof; however, since the points 38 and 39 contact the friction surface 8 at different times, this has no effect on the efficiency of the frictional contact.

In the case of a two-phase stimulus or excitation of the ultrasonic actuator according to the invention, the difference in respect of the form of the trajectories 40 and 41 of the friction elements 5 may be less pronounced, with both the ratio of the voltage amplitudes U1 and U2 and also the phase shift φ assuming an appropriate influence.

In the case of a two-phase excitation of the ultrasonic actuator according to the invention, the change in the movement direction of the element 9 to be driven is brought about by the reversal of the phase shift angle φ.

FIG. 10 shows an ultrasonic motor comprising an ultrasonic actuator according to the invention, on which four friction elements are arranged, said friction elements being arranged at the two opposite end faces 4 of the piezoelectric plate 3.

The invention claimed is:

1. An ultrasonic actuator made of polarized, piezoelectric material in the form of a single layered or multilayered flat rectangular plate with two main surfaces, which are largest in terms of surface area, at least four side surfaces connecting the main surfaces to one another and a thickness T, which is defined by the distance between the main surfaces in the direction of their surface normals, and in which at least one layer respectively comprises, both on the one main surface and on the other main surface arranged opposite thereto, two triangular electrodes arranged opposite one another, said electrodes being spaced apart from one another by a separation region extending diagonally, the electrodes of the one main surface being arranged offset by 90° to the electrodes of the other main surface, wherein two friction elements which are spaced apart from one another and provided for contact with at least one element to be driven by the ultrasonic actuator are arranged on at least one of the side surfaces.

2. The ultrasonic actuator as claimed in claim 1, wherein the friction elements are each arranged in the region of the side surface adjoined by the adjacent side surface.

3. The ultrasonic actuator as claimed in claim 2, wherein the friction elements are arranged on the side surface in such a way that they terminate flush with the adjacent side surface.

4. The ultrasonic actuator as claimed in claim 1, wherein it has four friction elements overall, the friction elements being arranged on opposite side surfaces.

5. The ultrasonic actuator as claimed in claim 1, wherein it is multilayered and has a plurality of layers of polarized and piezo-ceramic material, the polarization directions of adjacent layers being different and preferably opposite to one another.

6. The ultrasonic actuator as claimed in claim 1, wherein the thickness T is less than one third of the length of a side surface and more than one twentieth of the length of the same side surface.

7. The ultrasonic actuator as claimed in claim 2, wherein it has four friction elements overall, the friction elements being arranged on opposite side surfaces.

8. The ultrasonic actuator as claimed in claim 3, wherein it has four friction elements overall, the friction elements being arranged on opposite side surfaces.

9. The ultrasonic actuator as claimed in claim 2, wherein it is multilayered and has a plurality of layers of polarized and piezo-ceramic material, the polarization directions of adjacent layers being different and preferably opposite to one another.

10. The ultrasonic actuator as claimed in claim 3, wherein it is multilayered and has a plurality of layers of polarized and piezo-ceramic material, the polarization directions of adjacent layers being different and preferably opposite to one another.

11. The ultrasonic actuator as claimed in claim 4, wherein it is multilayered and has a plurality of layers of polarized and piezo-ceramic material, the polarization directions of adjacent layers being different and preferably opposite to one another.

12. The ultrasonic actuator as claimed in claim 2, wherein the thickness T is less than one third of the length of a side surface and more than one twentieth of the length of the same side surface.

13. The ultrasonic actuator as claimed in claim 3, wherein the thickness T is less than one third of the length of a side surface and more than one twentieth of the length of the same side surface.

14. The ultrasonic actuator as claimed in claim 4, wherein the thickness T is less than one third of the length of a side surface and more than one twentieth of the length of the same side surface.

15. The ultrasonic actuator as claimed in claim 5, wherein the thickness T is less than one third of the length of a side surface and more than one twentieth of the length of the same side surface.

* * * * *